(12) United States Patent
Lin

(10) Patent No.: US 11,395,442 B2
(45) Date of Patent: Jul. 19, 2022

(54) AIR HANDLING SYSTEM AND METHOD

(71) Applicant: Vertiv Corporation, Columbus, OH (US)

(72) Inventor: Zhiyong Lin, Dublin, OH (US)

(73) Assignee: Vertiv Corporation, Columbus, OH (US)

( * ) Notice: Subject to any disclaimer, the term of this patent is extended or adjusted under 35 U.S.C. 154(b) by 149 days.

(21) Appl. No.: 16/154,128

(22) Filed: Oct. 8, 2018

(65) Prior Publication Data

US 2019/0124796 A1     Apr. 25, 2019

Related U.S. Application Data

(60) Provisional application No. 62/576,990, filed on Oct. 25, 2017.

(51) Int. Cl.
   *H05K 7/20*             (2006.01)
   *F24F 12/00*           (2006.01)
   (Continued)

(52) U.S. Cl.
   CPC ......... *H05K 7/20745* (2013.01); *F24F 5/001* (2013.01); *F24F 5/0035* (2013.01);
   (Continued)

(58) Field of Classification Search
   CPC .......... F24F 5/0035; F24F 13/30; F24F 5/001; F24F 12/006; F24F 6/02; F24F 1/0007;
   (Continued)

(56) References Cited

U.S. PATENT DOCUMENTS

| 5,285,654 | A | * | 2/1994 | Ferdows | ............ | B60H 1/00371 |
| | | | | | | 261/103 |
| 6,935,132 | B1 | * | 8/2005 | Urch | ..................... | F24F 1/0007 |
| | | | | | | 62/324.1 |

(Continued)

FOREIGN PATENT DOCUMENTS

| CN | 105698314 | 6/2016 |
| CN | 205655425 U | 10/2016 |

(Continued)

OTHER PUBLICATIONS

White Paper—260, Specifying Data Center IT Pod Architectures (published Mar. 15, 2017) (Year: 2017).*

(Continued)

*Primary Examiner* — Emmanuel E Duke
(74) *Attorney, Agent, or Firm* — Harness, Dickey & Pierce, P.L.C.

(57) ABSTRACT

The present disclosure relates to an air handling system which has a fan supply section for intaking warm air from a room environment, and first and second indirect evaporative cooling subsystems (IDECs) spaced apart from one another to form an air plenum and a hot aisle in communication with the air plenum. The air plenum and the hot aisle are both formed between the IDECs, with the air plenum communicating with the fan supply section to receive the warm air. The IDECs receive the warm air and cool the warm air to produce first and second cooled airflows. The system also includes spaced apart cold aisles adjacent each of the IDECs for channeling the cooled airflows into an evaporator section. The evaporator section produces a final cooled airflow which is directed back into the room environment.

32 Claims, 2 Drawing Sheets

(51) Int. Cl.
*F24F 5/00* (2006.01)
*F25B 39/00* (2006.01)
*F24F 13/30* (2006.01)
*F28D 5/00* (2006.01)
*F28C 1/14* (2006.01)
*F24F 110/10* (2018.01)

(52) U.S. Cl.
CPC ............ *F24F 12/006* (2013.01); *F24F 13/30* (2013.01); *F25B 39/00* (2013.01); *F28C 1/14* (2013.01); *F28D 5/00* (2013.01); *F24F 2110/10* (2018.01); *F25B 2339/021* (2013.01)

(58) Field of Classification Search
CPC .......... F24F 1/0041; F24F 1/028; F24F 1/029; F24F 12/001; H05K 7/20745; H05K 7/20345; H05K 7/20145
USPC ....................................................... 62/259.4
See application file for complete search history.

(56) References Cited

U.S. PATENT DOCUMENTS

| | | | | | |
|---|---|---|---|---|---|
| 8,144,467 | B2* | 3/2012 | Campbell | .......... | H05K 7/20736 361/699 |
| 8,360,834 | B1 | 1/2013 | Semmes | | |
| 8,523,643 | B1* | 9/2013 | Roy | ................... | H05K 7/20145 454/184 |
| 2003/0074913 | A1* | 4/2003 | Ebara | ................... | F24F 3/1423 62/271 |
| 2005/0056042 | A1* | 3/2005 | Bourne | ................ | F24F 12/006 62/310 |
| 2008/0083237 | A1* | 4/2008 | Street | ................... | F25B 49/027 62/196.4 |
| 2009/0170420 | A1 | 7/2009 | Dubensky et al. | | |
| 2011/0237177 | A1 | 9/2011 | Stewart et al. | | |
| 2012/0211198 | A1* | 8/2012 | Kinkel | ................... | F24F 1/0328 165/104.14 |
| 2012/0298334 | A1 | 11/2012 | Madaffari et al. | | |
| 2016/0106008 | A1* | 4/2016 | Cotton | ................... | F24F 5/0035 165/248 |
| 2016/0131375 | A1* | 5/2016 | Barbato | ............. | H05K 7/20745 62/121 |
| 2017/0234571 | A1* | 8/2017 | Iio | .......................... | F24F 13/22 165/247 |
| 2017/0280593 | A1* | 9/2017 | Magallanes | ........ | H05K 7/20754 |
| 2017/0290200 | A1* | 10/2017 | Koga | ................. | H05K 7/20745 |
| 2017/0303443 | A1* | 10/2017 | Inano | ...................... | G06F 1/206 |

FOREIGN PATENT DOCUMENTS

| | | |
|---|---|---|
| CN | 206113186 U | 4/2017 |
| KR | 100851500 B1 | 8/2008 |
| WO | 2016055759 | 4/2016 |
| WO | 16207323 A1 | 12/2016 |

OTHER PUBLICATIONS

International Search Report and Written Opinion for corresponding International Application No. PCT/US2018/055118, dated Jan. 24, 2019, 11 pp.

First Office Action regarding Chinese Patent Application No. 201880064995.4, dated Feb. 2, 2021.

* cited by examiner

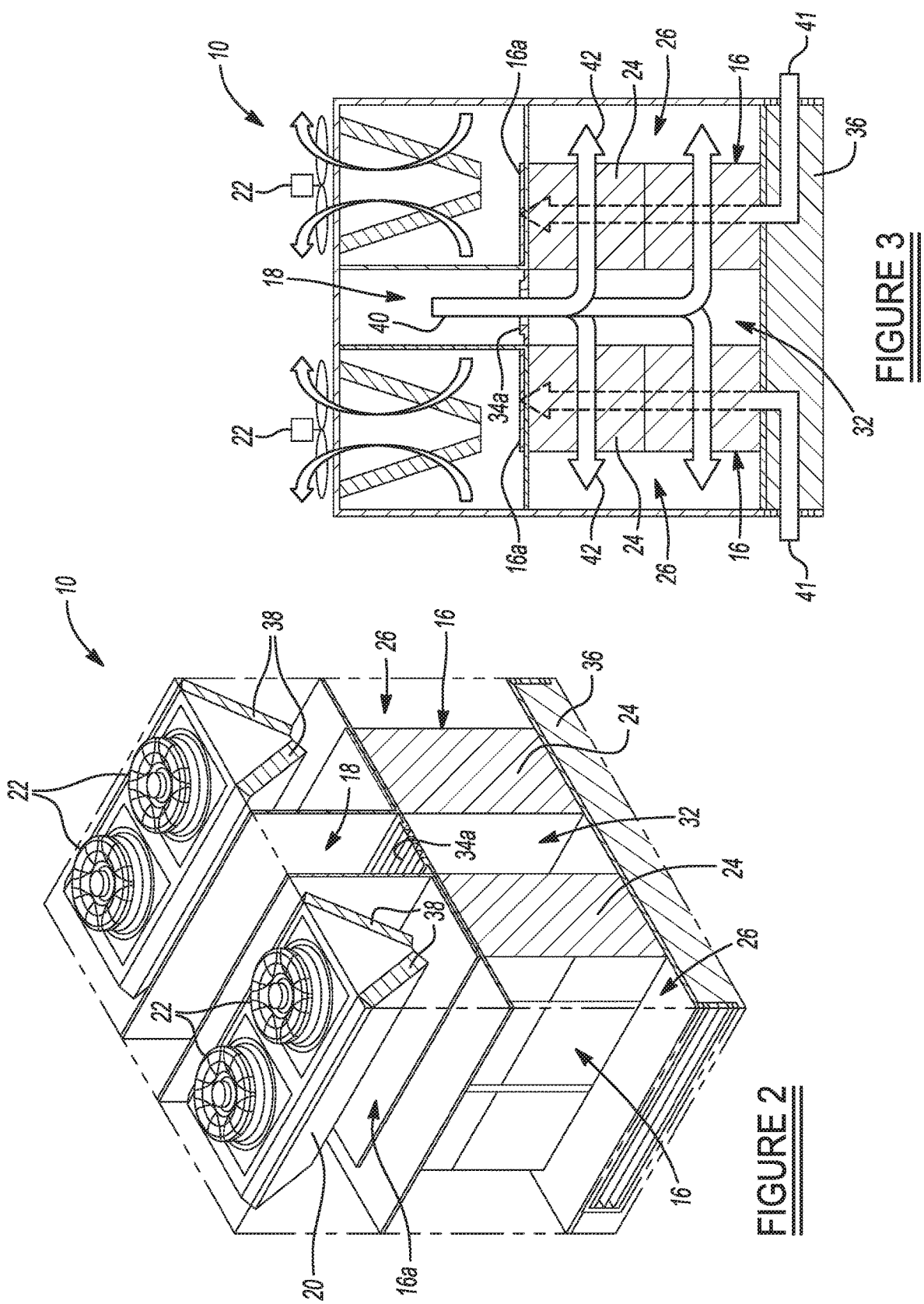

AIR HANDLING SYSTEM AND METHOD

CROSS-REFERENCE TO RELATED APPLICATIONS

This application claims the benefit of U.S. Provisional Application No. 62/576,990, filed on Oct. 25, 2017. The entire disclosure of the above application is incorporated herein by reference.

FIELD

The present disclosure relates to cooling devices, and more particularly to an air handling system well suited for air cooling operations in data centers.

BACKGROUND

The statements in this section merely provide background information related to the present disclosure and may not constitute prior art.

Present day evaporative free-cooling ("EFC") devices are widely used in commercial applications for managing thermal conditions in rooms, for example in data center rooms, where relatively large amounts of air need to be removed from a room, cooled and resupplied to the room. The assignee of the present disclosure, Vertiv Corporation, is a leader in the manufacture and sale of EFC devices. EFC devices rely on the evaporation of water (i.e., evaporative cooling) on one side of the device to help cool a warm airflow on the other side of the device. Water is atomized and sprayed into the non-saturated ingested air. The evaporation of the water on the outdoor ambient air stream cools the outdoor air and at the same time cools ingested warm air from the indoor room by heat transfer plates. When the external environment provides cooler air, such as during the winter months in many geographic areas, the ambient air can be used in a free-cooling mode of operation to cool the ingested warm air from the indoor room directly (dry operation mode). In the free-cooling mode the EFC device essentially operates as an air-to-air heat exchanger to cool the ingested warm air. Thus, the EFC device provides a plurality of operating modes that can be selected based on the external environment as well as the degree of cooling required.

While present day EFC devices have proven to be effective and valuable in medium and large scale cooling applications, the construction of these devices leaves room for improvement from an efficiency standpoint. For example, with one present day EFC design, the heat exchanger is constructed from 36 cross flow cubes (4×3×3). This stack design is simple from a mechanical structure perspective, but comes with two limitations. First, the stack design increases the air flow path and thus increases the air side pressure drop and the fan power required to move the ingested air through the device. Moreover, any slight mismatch of plate location between cubes can potentially cause an unexpected higher pressure loss. Secondly, the extremely large cross flow design cube will produce significant temperature stratification on exiting air. This temperature stratification during winter operation can potentially generate ice between plates at the bottom corner of a cube, and in rare instances even break the plate structure and cause large amounts of air leakage. In addition, the heat transfer capacity per heat exchanger volume decreases dramatically with the stack design of cross flow cubes. Studies have shown that when the overall dimension of the heat exchanger increases three times (volume increase will be nine times), the capacity per volume will decrease by ⅔. This decrease in capacity drives the increase in the size and weight of the heat exchanger.

Accordingly, there is still a need to improve the volume effectiveness of a heat exchanger. Improving the volume effectiveness will allow the size and weight of the heat exchanger to be reduced. Improving the volume effectiveness will also help to reduce the air side pressure drop, reduce the fan power required to move ingested air through the heat exchanger, and reduce the risk of freezing at low ambient temperatures.

SUMMARY

This section provides a general summary of the disclosure, and is not a comprehensive disclosure of its full scope or all of its features.

In one aspect the present disclosure relates to an air handling system. The system may comprise a fan supply section for intaking warm air from a room environment in which the air handling system is located. The system may also include first and second indirect evaporative cooling (IDEC) subsystems spaced apart from one another to form an air plenum and a hot aisle in communication with the air plenum. The air plenum and the hot aisle are both formed between the IDEC subsystems, with the air plenum being in airflow communication with the fan supply section for receiving the warm air. The IDEC subsystems receive the warm air and cool the warm air to produce first and second cooled airflows. The system also includes spaced apart cold aisles adjacent each of the IDEC subsystems for receiving and channeling the first and second cooled airflows output from the IDEC subsystems. The system also includes an evaporator section in flow communication with the cold aisles. The evaporator section receives the first and second cooled air flows and produces a final cooled airflow which is directed out from the air handling system back into the room environment.

In another aspect the present disclosure relates to an air handling system. The system has a fan supply section for intaking warm air from a room environment in which the air handling system is located. First and second condenser sections are also included along with first and second indirect evaporative cooling (IDEC) subsystems. The IDEC subsystems are positioned adjacent the fan supply section and elevationally below the first and second condenser sections. The first and second IDEC subsystems are spaced apart from one another to form an air plenum and a hot aisle therebetween. Both of the IDEC subsystems are in communication with the air plenum and the hot aisle. The air plenum and the hot aisle are in communication with one another, and the air plenum is in airflow communication with the fan supply section for receiving the warm air. The IDEC subsystems receive the warm air from the hot aisle and cool the warm air to produce first and second cooled airflows. Spaced apart cold aisles are included which are adjacent each of the IDEC subsystems and elevationally below the condenser. The cold aisles receive and channel the first and second cooled airflows output from the IDEC subsystems. An evaporator section is included which is disposed adjacent the IDEC subsystems and in flow communication with the cold aisles. The evaporator section receives the first and second cooled air flows and produces a final cooled airflow which is directed out from the air handling system back into the room environment.

In still another aspect the present disclosure relates to a method for forming an air handing unit. The method may comprise using a fan supply section to intake the warm air from the room environment in which the air handling system is located. The method may further include arranging first and second indirect evaporative cooling (IDEC) subsystems so as to be spaced apart from one another to form an air plenum and a hot aisle between the IDEC cooling subsystems. The method may further include placing the air plenum and the hot aisle in airflow communication with one another, and placing the hot air plenum in airflow communication with the fan supply section to receive the warm air ingested from the room environment by the fan supply section. The method may further include using the IDEC subsystems to receive the warm air flowing into the air plenum and to cool the warm air to produce first and second cooled airflows. The method may further include directing the first and second cooled airflows into spaced apart cold aisles adjacent each of the IDEC subsystems, and using an evaporator section in flow communication with the cold aisles to receive the first and second cooled air flows. The evaporator may be used to output a final cooled airflow back into the room environment.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

FIG. 2 is a view of a portion of the air handling unit of FIG. 1 with the evaporator section removed to better illustrate the internal airflow paths within the unit; and FIG. 3 is a simplified end view diagram of the unit of FIG. 1 illustrating how the ingested hot airflow flows through the various components and flow paths within the unit.

DETAILED DESCRIPTION

Figure 1:
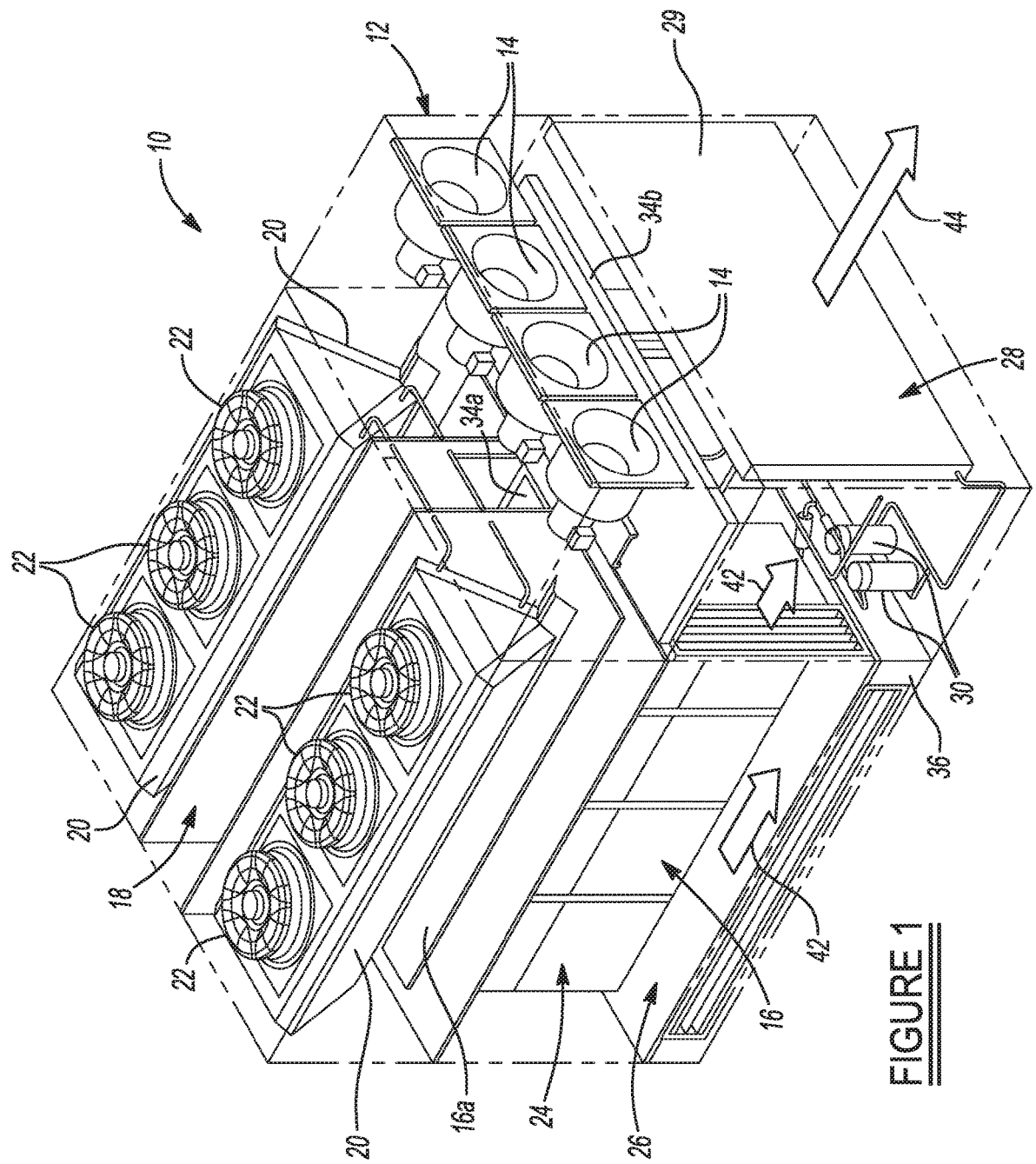
FIG. 1 is a high level perspective view of an air handling unit in accordance with one embodiment 6 of the present disclosure.

The following description is merely exemplary in nature and is not intended to limit the present disclosure, application, or uses. It should be understood that throughout the drawings, corresponding reference numerals indicate like or corresponding parts and features.

Referring to FIG. 1, an air handling system 10 in accordance with one embodiment of the present disclosure is shown. The air handling system forms an integrated air handling unit, and for convenience will be referred to hereafter simply as "air handling unit" 10. The air handling unit in this example includes a fan supply section 12 having a plurality of fans 14 for intaking warm air from an indoor room environment. The unit 10 further includes a pair of condenser and IDEC (indirect evaporative cooling) systems 16 (hereinafter "IDECs 16") that each have a water spray section 16a (hereinafter "spray sections 16a"). The IDECs 16 are spaced apart from one another to form a hot air plenum 18 therebetween. Each IDEC 16 further includes a condenser 20 having a plurality of condenser fans 22, and an evaporative air-to-air heat exchanger 24 (only one being visible in FIG. 1). The air-to-air heat exchangers 24 are disposed below their respective spray sections 16a. Adjacent each of the IDECs 16, on the side opposite to the hot air plenum 18, is a cold aisle 26. An evaporator section 28 having an evaporator coil 29 receives cooled air flowing through each of the cold aisles 26. Compressors 30 are located adjacent the evaporator section 28.

Referring to FIG. 2, the unit 10 is shown with the evaporator section 28 removed to better illustrate the internal airflow paths within the unit. The hot air plenum 18 communicates with a hot aisle 32 through a first damper 34a movable between open and closed positions. The hot aisle 32 is formed by the spacing between the two air-to-air heat exchangers 24 of the IDECs 16. The width and height of the hot aisle 32 in this example are dictated by the dimensions of the IDECs 16 and the spacing between them. A second damper 34b (FIG. 1), also movable between open and closed positions, may be controlled to permit return warm indoor air to flow directly through the evaporator section 28 when the first damper 34a is closed (i.e., thus forming a "dry" system). Otherwise, the second damper 34b remains closed when the first damper 34a is open so that all return warm airflow entering the hot aisle 32 will first flow through the IDECs 16 before reaching the evaporator section 28.

An outside air plenum and sump pan 36 may be disposed below the air-to-air heat exchangers 24 and the hot aisle 32 to receive an ambient air flow and to collect water emitted from the spray sections 16a for recirculation. The condenser 20 of each spray section 16a can also be seen to include a pair of condenser coils 38 configured, in this example, in a V-orientation. However, it will be appreciated that the condenser coils 38 could just as easily be configured in a parallel configuration.

Referring to FIG. 3, a simplified end view diagram of the unit 10 is shown to help illustrate the airflows through the unit. Initially, return indoor room warm air 40 ingested by fans 14 (FIG. 1) enters the hot air plenum 18. The warm air 40 flows downwardly through the open first damper 34a into the hot aisle 32 (this action assumes that the second damper 34b is closed). As the warm air 40 flows through the spray section 16a of each IDEC 16, cool atomized water is sprayed into the warm air 40. Alternatively, the air-to-air heat exchanger 24 of each IDEC 16 may be used exclusively to cool the warm air 40. In either event, each IDEC 16 produces a cooled airflow 42 that enters its respective cold aisle 26. The fans 22 of each spray section 16a draw outdoor ambient air 41 up through the air-to-air heat exchanger section 24 of each IDEC 16 to help cool the warm air 40 and produce the cooled airflow 42. Optionally, the water spray section 16a of each IDEC 16 could be configured to also spray atomized water on the coils of its condenser 20 to further help increase the efficiency of the condenser.

With reference to FIGS. 1 and 3, after entering the cold aisles 26, both cooled airflows 42 then make a 90 degree turn and flow generally horizontally through the cold aisles 26 into the evaporator section 28. The cooled airflows 42 are further cooled as they flow through the evaporator section 28 to form cold airflow 44 (shown in FIG. 1 only), which is discharged into the ambient environment. Optionally, the first damper 34a may be closed while the second damper 34b is opened to allow the indoor room warm air 40 to flow directly towards and through the evaporator section 28, in which case no evaporative cooling will be performed and the unit 10 will be functioning as a fully vapor compression cooling system.

Depending on the capacity required and/or space limitations, the hot aisle plenum 18 and the cold aisles 26 may be modified to increase or decrease their cross sectional flow areas, which will modify the capacity and the outer dimensions of the unit 10.

The design of the unit 10 provides a number of significant benefits over present day indirect evaporative cooling systems. By creating a hot aisle within the unit 10 and splitting the indoor room warm air flow 40 into two generally equal warm airflows, one going to each IDEC 16, the efficiency of each IDEC 16 (i.e., each heat exchanger "cube") is improved while reducing temperature stratification. Accordingly, there is a reduced risk of icing during winter months of operation of the unit 10. The unit 10 weight is also reduced over a conventional system for any given capacity because smaller, lighter heat exchanger sections 24 (i.e., "cubes") may be used, along with reduced framing materials and the elimination of a return plenum. Still further, since smaller evaporator sections 24 may be used to meet a given cooling requirement, the system 10 may be operated with less electrical power for any given cooling capacity as compared to a conventional IDEC system.

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. An air handling system, comprising:
   a fan supply section for intaking indoor room air from a room environment in which the air handling system is located;
   first and second indirect evaporative cooling (IDEC) subsystems spaced apart from one another to form an air plenum and a hot aisle in communication with the air plenum, the air plenum and the hot aisle both also being formed between the IDEC subsystems, the air plenum being in airflow communication with the fan supply section for receiving the indoor room air, the IDEC subsystems receiving the indoor room air and cooling the indoor room air to produce first and second cooled airflows;
   spaced apart cold aisles adjacent each of the IDEC subsystems for receiving and channeling the first and second cooled airflows output from the IDEC subsystems; and
   an evaporator section in flow communication with the cold aisles for receiving the first and second cooled air flows and producing a final cooled airflow which is directed out from the air handling system back into the room environment; and
   wherein the evaporator section is positioned adjacent the cold aisles so that the first and second cooled air flows exiting the IDEC subsystems each make a 90 degree turn to flow into the evaporator section.

2. The system of claim 1, wherein each of said first and second IDEC subsystems includes at least one condenser having at least one condenser fan.

3. The system of claim 2, wherein the at least one condenser includes:
   a pair of spaced apart condenser coils; and the at least one condenser fan positioned between the pair of spaced apart condenser coils.

4. The system of claim 3, wherein the pair of spaced apart condenser coils are arranged in a V-shape.

5. The system of claim 2, further comprising an outside air plenum and sump pan in communication with the condenser for enabling the indoor room air from the room environment to be ingested into at least one of the first or second IDEC subsystems.

6. The system of claim 1, further including first and second condensers;
the first condenser being disposed elevationally above the first IDEC subsystem and being operatively associated therewith; and
the second condenser being disposed elevationally above the second IDEC subsystem and being operatively associated therewith.

7. The system of claim 6, further comprising an outside air plenum and sump pan in communication with both of the condensers for enabling the indoor room air from the room environment to be ingested into both of the first and second IDEC subsystems.

8. The system of claim 1, wherein each of said first and second IDEC subsystems includes a spray section for spraying atomized water onto the indoor room air flowing therethrough.

9. The system of claim 1, wherein each one of said first and second IDEC subsystems includes an evaporative air-to-air heat exchanger.

10. The system of claim 1, further comprising a compressor in communication with the evaporator section.

11. The system of claim 1, further comprising a first damper movable between open and closed positions for separating the air plenum from the hot aisle.

12. The system of claim 11, further comprising a second damper movable between open and closed positions, the second damper permitting the indoor room air from the room environment to flow directly through the evaporator section when the first damper is in the closed position.

13. The system of claim 1, wherein the fan supply section is positioned elevationally above the evaporator section.

14. An air handling system, comprising:
a fan supply section for intaking indoor room air from a room environment in which the air handling system is located;
first and second condenser sections;
first and second indirect evaporative cooling (IDEC) subsystems positioned adjacent the fan supply section and elevationally below the first and second condenser sections;
the first and second IDEC subsystems spaced apart from one another to form an air plenum and a hot aisle therebetween, and wherein both of the IDEC subsystems are in communication with the air plenum and the hot aisle;
the air plenum and the hot aisle being in communication with one another and the air plenum being in airflow communication with the fan supply section for receiving the indoor room air, the IDEC subsystems receiving the indoor room air from the hot aisle and cooling the indoor room air to produce first and second cooled airflows;
spaced apart cold aisles adjacent each of the IDEC subsystems and elevationally below the condenser for receiving and channeling the first and second cooled airflows output from the IDEC subsystems; and
an evaporator section disposed adjacent the IDEC subsystems and in flow communication with the cold aisles for receiving the first and second cooled air flows and producing a final cooled airflow which is directed out from the air handling system back into the room environment.

15. The system of claim 14, wherein each of the first and second IDEC subsystems include:
a spray section for spraying an atomized fluid into the indoor room air; and
an evaporative air-to-air heat exchanger section.

16. The system of claim 14, further including a first damper disposed between the air plenum and the hot aisle, the first damper being movable between open and closed positions.

17. The system of claim 16, further including a second damper movable between open and closed positions, the second damper permitting the indoor room air from the room environment to flow directly through the evaporator section when the first damper is in the closed position.

18. The system of claim 14, further comprising an outside air plenum and sump pan in communication with both of the condensers for enabling the indoor room air from the room environment to be ingested into both of the IDEC subsystems.

19. A method for forming an air handing unit, comprising:
using a fan supply section to intake indoor room air from a room environment in which the air handling system is located;
arranging first and second indirect evaporative cooling (IDEC) subsystems so as to be spaced apart from one another, parallel to one another, with an intake side of each said IDEC subsystem facing the other, to form an air plenum and a hot aisle between the IDEC subsystems;
placing the air plenum and the hot aisle in airflow communication with one another;
placing the air plenum in airflow communication with the fan supply section to receive the indoor room air ingested from the room environment by the fan supply section;
splitting the indoor room air flowing into the air plenum into first and second portions within the hot aisle;
causing the first and second portions of the indoor room air to make 90 degree turns within the hot aisle, such that the second portion flows in a direction 180 degrees opposite to that of the first portion, and such that the first and second portions flow into the first and second IDEC subsystems, respectively,
using the first and second IDEC subsystems to receive the first and second portions of the indoor room air exiting the hot aisle and to cool the first and second portions of the indoor room air to produce first and second cooled airflows, respectively;
directing the first and second cooled airflows into spaced apart, parallel extending cold aisles adjacent each of the first and second IDEC subsystems, the cold aisles further being configured parallel one another, and parallel to the hot aisle;
using an evaporator section arranged to extend perpendicularly to the cold aisles, and such that the evaporator section covers both of the cold aisles, with the evaporator section being in flow communication with the cold aisles, and configured to receive the first and second cooled air flows and to output a final cooled airflow back into the room environment; and wherein the evaporator section is positioned adjacent the cold aisles so that the first and second cooled air flows exiting the IDEC subsystems each make a 90 degree turn to flow into the evaporator section.

20. An air handling system, comprising:
a fan supply section for intaking indoor room air from a room environment in which the air handling system is located;
first and second indirect evaporative cooling (IDEC) subsystems spaced apart from one another to form an air plenum and a hot aisle in communication with the air plenum, the air plenum and the hot aisle both also being formed between the IDEC subsystems, the air plenum being in airflow communication with the fan supply section for receiving the indoor room air, the IDEC subsystems receiving the indoor room air and cooling the indoor room air to produce first and second cooled airflows;
spaced apart cold aisles adjacent each of the IDEC subsystems for receiving and channeling the first and second cooled airflows output from the IDEC subsystems; and
an evaporator section in flow communication with the cold aisles for receiving the first and second cooled air flows and producing a final cooled airflow which is directed out from the air handling system back into the room environment;
a first damper movable between open and closed positions for separating the air plenum from the hot aisle; and
a second damper movable between open and closed positions, the second damper permitting the indoor room air from the room environment to flow directly through the evaporator section when the first damper is in the closed position.

21. The system of claim 20, wherein each of said first and second IDEC subsystems includes at least one condenser having at least one condenser fan.

22. The system of claim 21, wherein the at least one condenser of each one of said IDEC subsystems includes:
a pair of spaced apart condenser coils; and
the at least one condenser fan positioned between the pair of condenser coils.

23. The system of claim 22, wherein the spaced apart condenser coils are arranged in a V-shape.

24. The system of claim 21, further comprising an outside air plenum and sump pan in communication with the at least one condenser for enabling the indoor room air from the room environment to be ingested into at least one of the first or second IDEC subsystems.

25. The system of claim 20, further including first and second condensers;
the first condenser being disposed elevationally above the first IDEC subsystem and being operatively associated therewith; and
the second condenser being disposed elevationally above the second IDEC subsystem and being operatively associated therewith.

26. The system of claim 25, further comprising an outside air plenum and sump pan in communication with the first and second condensers for enabling the indoor room air from the room environment to be ingested into both of the first and second IDEC subsystems.

27. The system of claim 20, wherein each of said first and second IDEC subsystems includes a spray section for spraying atomized water onto the indoor room air flowing therethrough.

28. The system of claim 20, wherein each one of said first and second IDEC subsystems includes an evaporative air-to-air heat exchanger.

29. The system of claim 20, further comprising a compressor in communication with the evaporator section.

30. The system of claim 20, wherein the evaporator section is positioned adjacent the cold aisles so that the first and second cooled air flows exiting the first and second IDEC subsystems each make a 90 degree turn to flow into the evaporator section.

31. The system of claim 20, wherein the fan supply section is positioned elevationally above the evaporator section.

32. A method for forming an air handing unit, comprising:
using a fan supply section to intake indoor room air from a room environment in which the air handling system is located;
arranging first and second indirect evaporative cooling (IDEC) subsystems so as to be spaced apart from one another, parallel to one another, with an intake side of each said IDEC subsystem facing the other, to form an air plenum and a hot aisle between the IDEC subsystems;
placing the air plenum and the hot aisle in airflow communication with one another;
placing the air plenum in airflow communication with the fan supply section to receive the indoor room air ingested from the room environment by the fan supply section;
splitting the indoor room air flowing into the air plenum into first and second portions within the hot aisle;
causing the first and second portions of the indoor room air to make 90 degree turns within the hot aisle, such that the second portion flows in a direction 180 degrees opposite to that of the first portion, and such that the first and second portions flow into the first and second IDEC subsystems, respectively,
using the first and second IDEC subsystems to receive the first and second portions of the indoor room air exiting the hot aisle and to cool the first and second portions of the indoor room air to produce first and second cooled airflows, respectively;
directing the first and second cooled airflows into spaced apart, parallel extending cold aisles adjacent each of the first and second IDEC subsystems, the cold aisles further being configured parallel one another, and parallel to the hot aisle;
using an evaporator section arranged to extend perpendicularly to the cold aisles, and such that the evaporator section covers both of the cold aisles, with the evaporator section being in flow communication with the cold aisles, and configured to receive the first and second cooled air flows and to output a final cooled airflow back into the room environment;
using a first damper movable between open and closed positions for separating the air plenum from the hot aisle; and
using a second damper movable between open and closed positions, the second damper permitting the indoor room air from the room environment to flow directly through the evaporator section when the first damper is in the closed position.

* * * * *